(12) United States Patent
Kim et al.

(10) Patent No.: US 12,140,550 B2
(45) Date of Patent: Nov. 12, 2024

(54) SELECTIVE MARKING OF A SUBSTRATE WITH FLUORESCENT CONJUGATED POLYMER PROBES HAVING A SMALL FORM FACTOR

(71) Applicant: KLA Corporation, Milpitas, CA (US)

(72) Inventors: Jinsang Kim, Ann Arbor, MI (US); Grace Chen, Los Gatos, CA (US)

(73) Assignee: KLA Corporation, Milpitas, CA (US)

( * ) Notice: Subject to any disclaimer, the term of this patent is extended or adjusted under 35 U.S.C. 154(b) by 22 days.

(21) Appl. No.: 18/101,573

(22) Filed: Jan. 25, 2023

(65) Prior Publication Data

US 2023/0236134 A1    Jul. 27, 2023

Related U.S. Application Data

(60) Provisional application No. 63/303,551, filed on Jan. 27, 2022.

(51) Int. Cl.
| | |
|---|---|
| *G01N 21/91* | (2006.01) |
| *G01N 21/64* | (2006.01) |
| *G01N 21/95* | (2006.01) |

(52) U.S. Cl.
CPC ........... *G01N 21/91* (2013.01); *G01N 21/643* (2013.01); *G01N 21/9501* (2013.01); *G01N 2021/6439* (2013.01); *G01N 2021/646* (2013.01)

(58) Field of Classification Search
CPC .. G03F 7/7065; G01N 21/91; G01N 21/9501; G01N 21/643; G01N 21/6456; G01N 2021/646; G01N 2021/6439; H01L 22/12
USPC ........................................................ 436/5, 172
See application file for complete search history.

(56) References Cited

U.S. PATENT DOCUMENTS

| | | | |
|---|---|---|---|
| 7,411,019 B1 * | 8/2008 | Bley ...................... | C08L 63/00 977/749 |
| 11,300,768 B2 | 4/2022 | Lim | |
| 2003/0129764 A1 | 7/2003 | Armstrong et al. | |
| 2007/0158642 A1 * | 7/2007 | Gruner ................ | H10K 10/466 257/30 |
| 2009/0025595 A1 * | 1/2009 | Mayers ................ | G03F 7/0002 101/493 |
| 2009/0035677 A1 * | 2/2009 | Ferrar ................ | G03G 5/0651 430/64 |
| 2009/0179240 A1 * | 7/2009 | Bourgoin ............... | B82Y 10/00 257/292 |
| 2011/0244661 A1 * | 10/2011 | Dai ..................... | H01L 29/1606 977/932 |
| 2020/0408700 A1 | 12/2020 | Shirakawa et al. | |

(Continued)

OTHER PUBLICATIONS

Curran, S. A. et al., Advanced Materials 1998, 10, 1097-1093. (Year: 1998).*

(Continued)

*Primary Examiner* — Arlen Soderquist
(74) *Attorney, Agent, or Firm* — Hodgson Russ LLP

(57) ABSTRACT

A photoluminescent material can be applied to part of a substrate as part of substrate inspection. The photoluminescent material includes a conjugated polymer having a coiled macroscopic molecular shape and a meta-linkage or an ortho-linkage. The substrate is imaged using an inspection system. The conjugated polymer can be, for example, poly (m-phenylene ethynylene) (PPE) or poly(para-phenylene vinylene) (PPV).

16 Claims, 6 Drawing Sheets

(56) References Cited

U.S. PATENT DOCUMENTS

2023/0062418 A1    3/2023    Chen et al.

OTHER PUBLICATIONS

Pang, Y. et al., Macromolecules 1998, 31, 6730-6732 (Year: 1998).*
Xu, B. et al., Synthetic Metals 1999, 107, 47-51. (Year: 1999).*
Lipson, S. M. et al., Synthetic Metals 2000, 111-112, 553-557. (Year: 2000).*
Liao, L. et al., Journal of Polymer Science Part A: Polymer Chemistry 2003, 41, 2650-2658. (Year: 2003).*
Lai, Q, Dissertation 2009, 161 pages. (Year: 2009).*
Kim et al., "Control of conformational and interpolymer effects in conjugated polymers," Macmillan Magazines Ltd, Nature, Letters to Nature, Jun. 28, 2001, vol. 411, pp. 1030-1034.
Lee et al., "Design Principle of Conjugated Polyelectrolytes to Make Them Water-Soluble and Highly Emissive," Advanced Functional Materials, Jan. 9, 2012, vol. 22, pp. 1076-1086, Wiley-VCH Verlag GmbH & Co. KGaA, Neinheim.
Kim et al., "Energy Level Modulation of HOMO, LUMO, and Band-Gap in Conjugated Polymers for Organic Photovoltaic Applications," Advanced Functional Materials, Sep. 14, 2012, vol. 23, pp. 439-445, Wiley-VCH Verlag GmbH & Co. KGaA, Weinheim.
Lee et al., "Conjugated Polyelectrolyte-Antibody Hybrid Materials for Highly Fluorescent Live Cell-Imaging," Advanced Functional Materials, Apr. 10, 2012, vol. 24, pp. 2479-2484, Wiley-VCH Verlag GmbH & Co. KGaA, Weinheim.
Lee et al., "Conjugated Polymers Combined with a Molecular Beacon for Label-Free and Self-Signaling-Amplifying DNA Microarrays," Advanced Functional Materials, Sep. 8, 2009, vol. 19, pp. 3317-3325, Wiley-VCH Verlag GmbH & Co. KGaA, Weinheim.
Lee et al., "Signal-Amplifying Conjugated Polymer-DNA Hybrid Chips," Angewandte Chemie Int. Ed. 2007, vol. 46, pp. 4667-4670, Wiley-VCH Verlag GmbH & Co. KGaA, Weinheim.
Kim et al., "Organic Dye Design Tools for Efficient Photocurrent Generation in Dye-Sensitized Solar Cells: Exciton Binding Energy and Electron Acceptors," Advanced Functional Materials, Feb. 6, 2012, vol. 22, pp. 1606-1612, Wiley-VCH Verlag GmbH & Co. KGaA, Weinheim.
Zhao et al., "Meta-Linked Poly(phenylene ethynylene) Conjugated Polyelectrolyte Featuring a Chiral Side Group: Helical Folding and Guest Binding," Langmuir, Apr. 12, 2006, vol. 22, pp. 4856-4862, American Chemical Society.
Chattopadhyay et al., "Brilliant Violet Fluorophores: A New Class of Ultrabright Fluorescent Compounds for Immunofluorescence Experiments," Cytometry Part A, 2012, pp. 456-466, vol. 81A.
Brilliant Violet, "Complete Brilliance for the Violet Laser: Novel Fluorophore Conjugates for Flow Cytometry," BioLegend.
Nguyen et al., "Super-Resolution Fluorescence Imaging for Semiconductor Nanoscale Metrology and Inspection," American Chemical Society, NANO Letters, Dec. 7, 2022.
Pucci et al., "Green-blue luminescence dichroism of cyano-containing poly[(m-phenylene ethynylene)-alt-(p-phenylene ethynylene)] aggregates dispersed in oriented polyethylene," Polymer, Oct. 26, 2005, vol. 46, pp. 11198-11205.
Liu et al., "An efficient conjugated polymer sensor based on the aggregation-induced fluorescence quenching mechanism for the specific detection of palladium and platinum ions," Journal of Materials Chemistry, Jan. 19, 2012, vol. 22, pp. 3555-3561.
Szymanski et al., "Single Molecule Nanoparticles of the Conjugated Polymer MEH-PPV, Preparation and Characterization by Near-Field Scanning Optical Microscopy," The Journal of Physical Chemistry B Letters, Sep. 4, 2005, vol. 109, pp. 8543-8546.
WIPO, International Search Report for International Application No. PCT/US2023/011664, May 26, 2023.
WIPO, Written Opinion of the International Searching Authority for International Application No. PCT/US2023/011664, May 26, 2023.

* cited by examiner

SELECTIVE MARKING OF A SUBSTRATE WITH FLUORESCENT CONJUGATED POLYMER PROBES HAVING A SMALL FORM FACTOR

CROSS-REFERENCE TO RELATED APPLICATIONS

This application claims priority to the provisional patent application filed Jan. 27, 2022 and assigned U.S. App. No. 63/303,551, the disclosure of which is hereby incorporated by reference.

FIELD OF THE DISCLOSURE

This disclosure relates to defect detection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor or other substrate manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As the demand for semiconductor or other substrates having smaller device features continues to increase, the need for improving defect detection mechanisms continues to grow. Current inspection systems rely on principles of light scattering for defect signal generation. However, one disadvantage of using light scattering principles is that defect signal generation is directly proportional to the size of the defect, where the defect signal decreases as the size of the defect shrinks.

Wafer noise induced by process variation increases with each node and will continue to increase. The increase in wafer noise is caused by at least three factors: (1) difficulty manufacturing smaller design structures, (2) keeping similar length scales of surface roughness, edge roughness, and edge placement error, and (3) noise scattering elements that are packed more densely as a design structure shrinks. This poses a challenge for current inspection systems that rely on light scattering principles.

To keep up with the sensitivity demand, shorter wavelength inspection platforms are needed. However, development of future shorter wavelengths also faces challenges. For example, the development of light sources and sustainable optics for shorter wavelengths are insufficient to support inspection throughput demand and development of these components can be too costly for inspection tool developers.

Fluorescent probes can improve defect detection during semiconductor manufacturing. There are generally five types of fluorescent probes: small molecular fluorescent dyes, quantum dots, carbon dots, fluorescent proteins, and conjugated polymers. However, each of these fluorescent probes has its own limitations. None is small enough to fit minimally 5-10 fluorescent probes within one defect (e.g., approximately 10 nm×10 nm in area) and/or large enough so that the fluorescent probe will not amplify the pattern edge noise. Small molecular fluorescent dyes suffer from a low molar extinction coefficient of 300,000 $M^{-1}cm^{-1}$. Quantum dots have a typical size of greater than 5 nm per probe, which makes it difficult to fit at least 5-10 probes per defect. Emission intensity uniformity and the stability of spectral responses for quantum dots also are concerns. For example, the quantum dot emission spectrum depends on its size. Controlling size down to <1 nm is challenging and, hence, the spectral stability of quantum dots can be difficult to control. Carbon dots are still in their early development and generally have limited control of color, brightness, and functionalization. Stringent purification can be required to ensure that carbon dot emission is uniform. Fluorescent proteins are too big because their size is generally 10-20 nm. Conjugated polymers can have a large extinction coefficient and a high quantum yield. However, conventional conjugated polymers having para-linkage along the backbone have a linear rod-like structure, which is unsuitable for the size requirement.

Therefore, new compositions and methods are needed. More particularly, new conjugated polymers are needed.

BRIEF SUMMARY OF THE DISCLOSURE

A method is provided in a first embodiment. The method includes applying a photoluminescent material to part of a substrate. The photoluminescent material includes a conjugated polymer having a coiled macroscopic molecular shape and a meta-linkage or an ortho-linkage. The substrate is then imaged using an inspection system.

The conjugated polymer can include poly(m-phenylene ethynylene) (PPE) or poly(para-phenylene vinylene) (PPV).

In an instance, the conjugated polymer has the meta-linkage. In another instance, the conjugated polymer has the ortho-linkage.

The conjugated polymer can have a molar extinction ratio of greater than $10^6$ $M^{-1}cm^{-1}$ and a quantum yield of greater than 50%.

The substrate can be a semiconductor wafer. The part of the substrate can be a metal, such as copper, tungsten, cobalt, ruthenium, or aluminum. The part of the substrate also can be an insulator. The part of the substrate can have a feature dimension of 20 nm or less.

The coiled macroscopic molecular shape can be less than or equal to 5 nm in diameter. For example, the diameter can be less than or equal to 4 nm. In another example, the diameter can be from 2-5 nm.

The conjugated polymer can include a functional group configured to link to the part of the substrate. The functional group can include a thiol, phosphonate, silane, catechol, or galloyl.

The inspection system can include a light source, a stage to hold the substrate, and a detector configured to detect photoluminescent emission from the photoluminescent material.

The method can further include performing defect detection of the substrate using an image from the imaging.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein leverage fluorescent probes to enhance defect signal for an optical inspection platform. These can be used to inspect semiconductor wafers or other substrates. As design rule of integrated circuit devices shrinks, defect size also shrinks, making it challenging for optical inspection platform to meet manufacturing yields. Selective attachment of fluorescence probes to wafer patterns can enhance defect signal. The disclosed embodiments provide a cost-effective solution that keeps up with the inspection sensitivity for future designs using current optical inspection platforms.

To support inspection throughput demand of the market, such as one wafer per hour, the fluorescent probe can have a molar absorption extinction of $>10^6$ $M^{-1}cm^{-1}$ (or >5% absorption probability) and a high quantum yield. Besides emissive property consideration, the size of the fluorescent probe is configured for these inspection applications. The size can be small enough to fit minimally 5-10 fluorescent probes within one defect (e.g., approximately 10 nm×10 nm in area) for statistical robustness and large enough so that the fluorescent probe will not amplify the pattern edge noise. The edge roughness is typically approximately 1 nm deviating from the ideal edge. Hence, if the probe is, for example, approximately 1 nm, it will follow the edge roughness line. An ideal signal probe can filter out the edge roughness, so a probe larger than 2 nm may reduce amplification. A series of conjugated polymers are disclosed herein to support these inspection demands.

Figure 1:
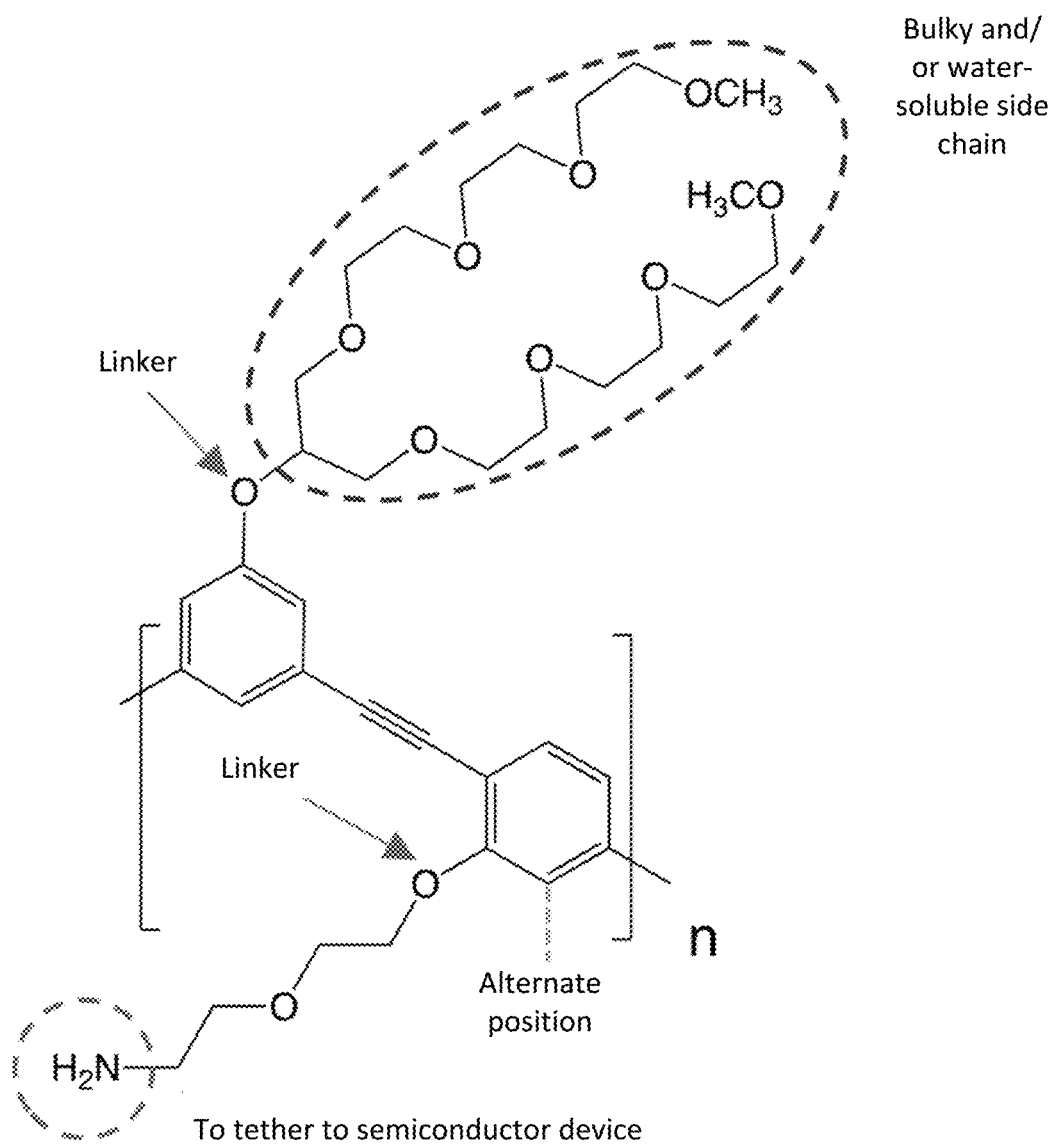
FIG. 1 is an exemplary molecule in the fluorescent probe disclosed herein.

Poly(p-phenylene ethynylene)s (PPEs) and other conjugated polymers have shown high quantum yields and high extinction coefficients. Engineered conjugated polymers also showed excellent solubility in water. To satisfy the small size requirement, a meta-linkage is used instead of conventional para-linkage to render a coiled macroscopic molecular shape instead of the rod-like shape of the conventional conjugated polymers. An example using PPE is shown in FIG. 1. While tethered to a semiconductor device in FIG. 1, the conjugated polymer can be tethered to other parts of a substrate.

FIG. 1 shows that the conjugated polymer is tethered to a semiconductor device using a functional group. The functional group is connected to the conjugated polymer using a linker. A bulky and/or water soluble side chain also is connected using a linker. The conjugated polymer can have length n. While the linker and functional group are illustrated in a position, an alternate position for the linker and functional group is illustrated with a dotted line (marked alternate position).

In an instance, conjugated polymers, such as PPEs, having a coiled macroscopic molecular shape are produced. The conjugated polymers can include meta-linkages or ortho-linkages. The coiled macroscopic molecular shape can be less than or equal to 5 nm in diameter, less than or equal to 4 nm in diameter, or less than or equal to 3 nm in diameter. In an instance, the coiled macroscopic molecular shape can be from 2-5 nm in diameter (e.g., 3 nm). The diameter is a non-zero value. The conjugated polymer may be substantially symmetric in an instance.

While PPEs are disclosed, other fluorescent conjugated polymers can be used. For example, poly(para-phenylene vinylene) (PPV) can be used. The various conjugated polymers can be synthesized via a palladium cross-coupling reaction or other reactions.

Four design parameters are considered to tune the highest occupied molecular orbital (HOMO) and lowest unoccupied molecular orbital (LUMO), bandgap, solubility, hydrophobicity and hydrophilicity, and size of the poly(m-phenylene ethynylene)s or other conjugated polymers. These design parameters include a linker unit, side chains, linker position, and a degree of polymerization. Controlling these parameters can provide tunable physicochemical properties of the resulting conjugated polymers as a fluorescent probe.

The linker unit can be an electron donor or acceptor. This can affect HOMO and bandgap. For example, the linker unit may include, but is not limited to, polydopamine, polynorepinephrine, or a self-assembled monolayer material. Examples of the linker unit are disclosed in U.S. application Ser. No. 17/887,078, the relevant portions of which are incorporated by reference in their entireties.

The linker molecule may be used to functionally and/or physically separate the photoluminescent material (e.g., the photoluminescent molecule) from the material of the substrate to maximize the efficiency of the photoluminescent properties of the photoluminescent material. The length of the linker molecule may be adjusted to balance the physical separation of a luminescent molecule from other molecules that may induce quenching of the photoluminescent output.

The side chain can tune the solubility in various solvents (e.g., water). A side chain's bulkiness combined with the meta-linkage or ortho-linkage can prevent fluorescence quenching. The functional group with the side chain can provide tethering to various materials on the substrate.

The linker position can affect the size of the polymer at a given contour length. The linker position can be affected by the meta-linkage or para-linkage.

The degree of polymerization can affect the length and bandgap of the conjugated polymer. Each repeating unit is approximately 14 Angstrom. The number of repeating units in each polymer chain will determine the length of the conjugated polymers. The degree of polymerization may be from 4 or 5 up to several hundreds.

The conjugated polymers, such as PPEs, can include a functional group configured to link to a metal or other materials.

The conjugated polymers disclosed herein have a high extinction coefficient. The conjugated polymers can have a molar extinction ratio of greater than $10^6$ $M^{-1}cm^{-1}$, where M stands for molarity and quantum yield is greater than 50%. The molar extinction ratio and quantum yield affect brightness. A higher brightness helps with substrate inspection and defect detection.

The conjugated polymers disclosed herein can include a coiled backbone rendering 3-dimensional volume to sustain high absorption probability.

The conjugated polymers disclosed herein can provide a minimal 5-10 probes per defect for statistical robustness. The bulky side chain design disclosed herein can prevent fluorescent emission quenching via aggregation so that effective quantum yield remains high (e.g., >50%). The disclosed linker group and side chain versatility can allow bandgap tuning and solubility control in various solvents. These solvents can include water. A functional size chain and chain-end modification for various chemistries can tether the fluorescent probe to materials on the substrate.

A meta-linkage or ortho-linkage in a conjugated polymer (e.g., PPE) and conjugated polyelectrolyte (CPE) can form super-bright fluorophores with a small form factor with a projected size of approximately 3-4 nm. Any conjugated polymers having a large extinction coefficient, a high quantum yield, and a small form factor may work as a CPE. Some or all of the functional groups and other specifications of the conjugated polymers can apply to the CPE. The design of a bulky side chain of, for example, m-PPE and m-CPE can enable correct functionality and retain quantum yield. The linker group and side chain versatility can be optimized to allow fine-tuning of band gap to meet inspection application requirements.

Figure 2:
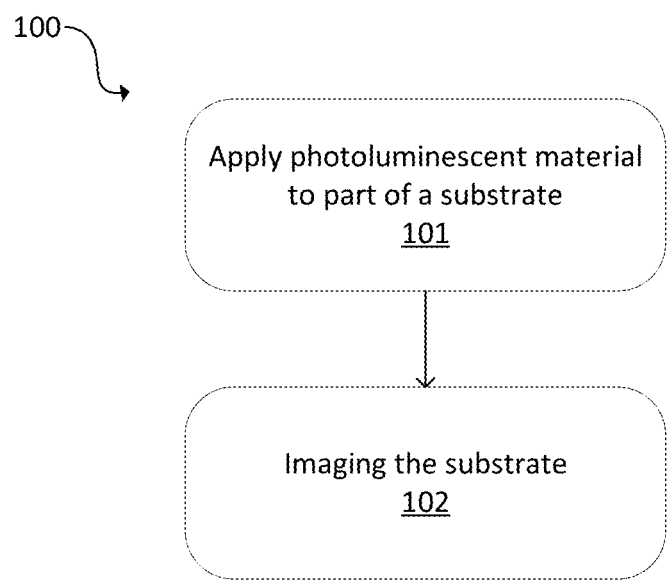
FIG. 2 is a flowchart of a method embodiment in accordance with the present disclosure.

A method 100 is shown in FIG. 2. Defect inspection for advanced node integrated circuit devices is becoming more challenging. The fluorescent probes disclosed herein can have a strong optical emission, which can be used to enhance defect signal. The optical emission spectrum of the fluorescent probe may be within the wavelength range of 260-800 nm. This super-bright fluorescent probe can enable current inspection platforms to continue providing sensitivity required for future integrated circuit design nodes or other advanced devices.

A photoluminescent material is applied to part of a substrate at 101. The photoluminescent material can include an embodiment of the conjugated polymers disclosed herein (e.g., PPEs). The conjugated polymers have a coiled macroscopic molecular shape. The conjugated polymers can include meta-linkages or ortho-linkages. The substrate can be a semiconductor wafer or other type of substrate.

In an instance, linker molecules can have a specific reaction on a particular material. The linker molecule also has a functional group that can be used to tether a fluorescent reporter molecule such as PPE or other conjugated polymers.

The part of the substrate that receives or selectively attaches with the photoluminescent material can have, for example, a feature dimension of 20 nm or less (e.g., from 1 nm to 20 nm or from 1 nm to 10 nm). Examples of a feature dimension include a width, length, or cross-section. This feature dimension may be, for example, a width of a metal line of a semiconductor device. Other dimensions or shapes are possible.

The substrate is imaged using an inspection system at 102. An example of a method of imaging and an inspection system is shown in U.S. application Ser. No. 17/887,078, which is incorporated by reference. In an instance, the inspection system can include a light source, a stage to hold the substrate, and a detector configured to detect photoluminescent emission from the photoluminescent material.

The part of the substrate that the photoluminescent material is applied to can be a metal, such as copper, tungsten, cobalt, ruthenium, or aluminum. In an example, the photoluminescent material is applied to a metal line on a substrate to inspect the metal line. In another example, the part of the substrate that the photoluminescent material is applied to can be an insulator, such as $SiO_2$, SiN, or low-k materials.

The conjugated polymers can include a functional group configured to link to the part of the substrate. The functional group can include thiol, phosphonate, silane, catechol, galloyl, or other materials. The conjugated polymers can preferentially link to the part of the substrate and not to elsewhere on the substrate.

The photoluminescent material may be configured to selectively attach to at least one of a first material or a second material of a substrate, such as those materials found on a patterned semiconductor wafer. For instance, a light source may be configured to excite the photoluminescent material of the first material or the second material to cause the photoluminescent material to emit photoluminescent emission. The photoluminescent material may be configured to preferentially attach to one of the first material or the second material to enhance the photon emission of a feature of interest (e.g., a defect of interest, a pattern of interest, or a material of interest) formed of at least one of the first material or the second material. As such, this preferential amplification may enhance the signal contrast. The scattering signal may depend on a volume of the defect. Embodiments of the present disclosure may modify a surface of a substrate by selectively attaching a photoluminescent material to the surface of the substrate. A thin defect (e.g., a defect with a shallow depth) may have the same amount of photoluminescent signal as a thick defect (e.g., a defect with a larger z-depth). The signal generation of the photoluminescent material of the present disclosure may be area dependent, rather than volume dependent. In this regard, the signal of the thin defect may be enhanced.

In an embodiment, the photoluminescent material may have a lifetime in the nanosecond scale. A photoluminescent material with a lifetime on the nanosecond scale may be efficient in generating photons. For example, a photoluminescent material with a lifetime of 10 nanoseconds may generate $10^5$ photons (in milliseconds scale) per millisecond. In this regard, photon generation may be more efficient than optical scattering. Photoluminescent signal generation is typically higher than scatter signal generation. The signal of the feature of interest (e.g., defect of interest, pattern of interest, or material of interest) is enhanced compared to the scattered-based method.

Figure 3:
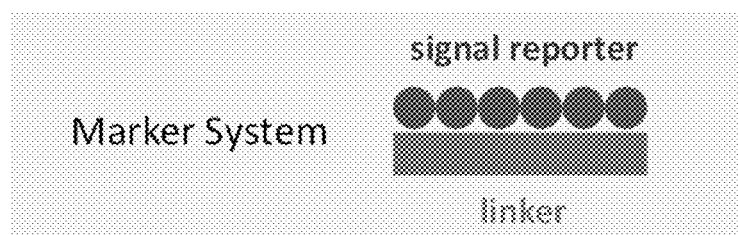
FIG. 3 an example of a signal report and linker.
Figure 4:
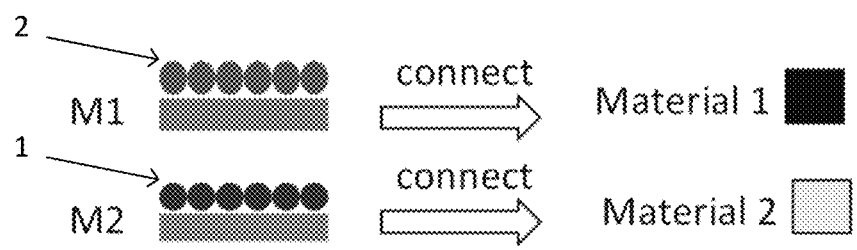
FIG. 4 shows that the signal characteristics of the signal reporters can be different.

FIG. 3 an example of a signal report and linker. The linker connects to a material of interest. This connection may be unique to the material of interest. The signal reporter tethered on the linker can have characterized optical properties. FIG. 4 shows that the signal characteristics of the signal reporters are different for the different materials (designated as 1 and 2 in FIG. 4).

Figure 5:
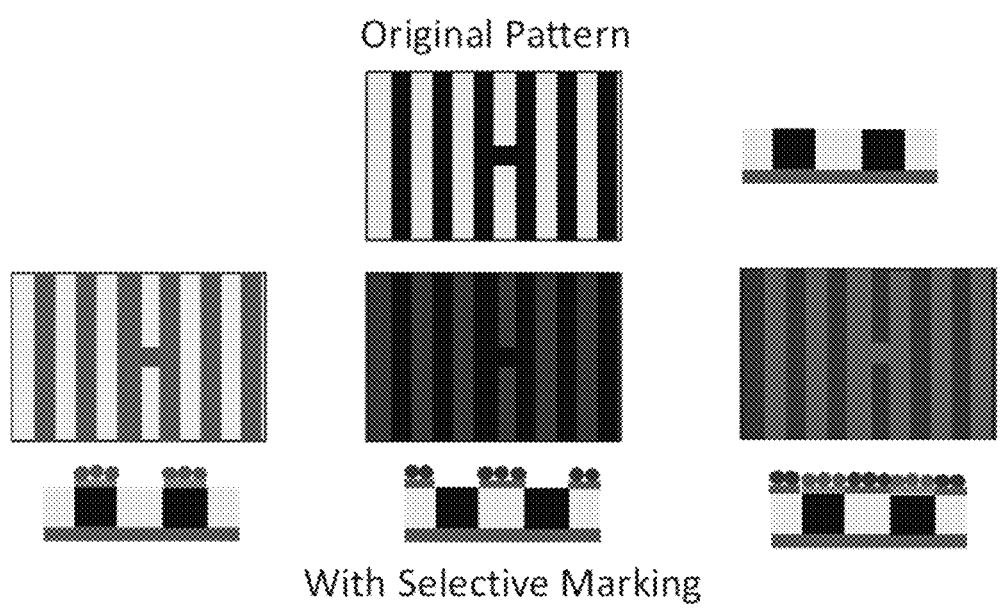
FIG. 5 shows exemplary patterns with selective marking.
Figure 6:
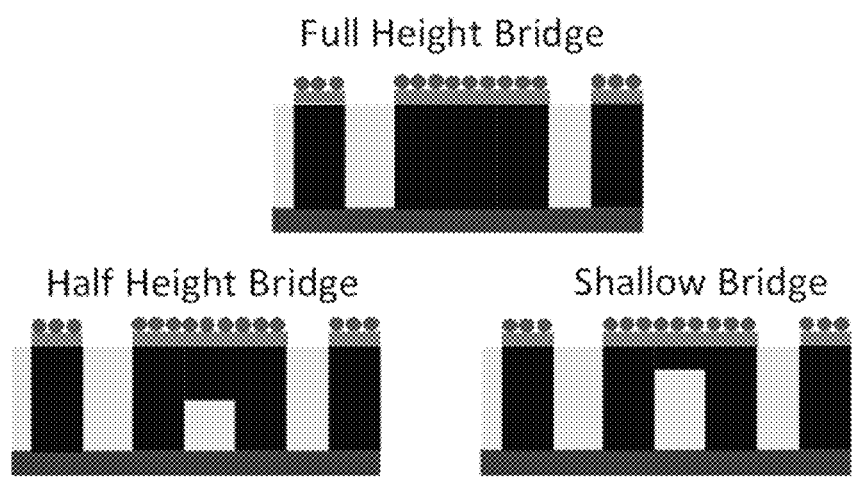
FIG. 6 shows exemplary patters with selective marking.

FIGS. 5-6 show exemplary patterns with selective marking. The resulting signal may be the same independent of the height of the defect.

As shown in FIGS. 3-6, the substrate may include one or more photoluminescent materials configured to selectively bind to one of the first material or the second material to enhance a feature of interest on the substrate. For example, the one or more photoluminescent materials may be configured to preferentially attach to a targeted material (e.g., the first material or the second material) to enable the targeted material to have enhanced photon emission based on the properties of the photoluminescent material. In an instance, the one or more photoluminescent materials may be configured to preferentially attach to the first material and not the second material, such that only the signal from the first material is enhanced. In another instance, the one or more photoluminescent materials may be configured to preferentially attach to the second material and not the first material, such that only the signal from the second material is enhanced.

A feature of interest may include, but is not limited to, a defect of interest, a pattern of interest, or a material of interest. For example, the one or more photoluminescent materials may be configured to selectively bind to one of the first material or the second material to enhance a defect of interest. In another example, the one or more photoluminescent materials may be configured to selectively bind to one of the first material or the second material to enhance a pattern of interest. In yet another example, the one or more photoluminescent materials may be configured to selectively bind to one of the first material or the second material to enhance a material of interest.

In some embodiments, the photoluminescent material may have a photoluminescent emission time scale less than or equal to 10 nanoseconds (ns). For example, the photoluminescent material may have a photoluminescent emission time scale between 2 ns and 10 ns. The signal of the photoluminescent material may be enhanced. The photoluminescent material may emit more photons than photon generation through scattering. For example, a fluorophore with a lifetime of 10 ns can generate $10^5$ photons in 1 millisecond (ms), which is higher than traditional light interaction via scattering. As such, the signal may be enhanced.

In an embodiment, the photoluminescent material may have a spatial characteristic length from 2 nm and 5 nm (e.g., from 2 nm to 4 nm). For example, in a non-limiting example, the edge noise due to the line roughness and edge displacement may be approximately 1-2 nm, such that the spatial characteristic length of 2-4 nm may serve as a spatial filter to reduce the sensitivity to the presence of edge roughness and edge placement error. The edge roughness and edge placement error may be selectively desensitized, thereby reducing noise.

In an embodiment, the photoluminescent material may be configured to selectively bind at the surface level of one of the first material or the second material. The noise from the stack and previous layers may be minimized.

Defect detection may be performed using images of substrates with the photoluminescent material using an inspection system. A processor can be used to determine placement or a population of defects from these images. The fluorescent probes disclosed herein can have a strong optical emission, which can be used to enhance defect signal in the image. The preferential amplification may enhance signal contrast.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of substrate inspection comprising:
    applying a photoluminescent material to part of a substrate, wherein the photoluminescent material includes a conjugated polymer having a coiled macroscopic molecular shape and a meta-linkage or an ortho-linkage, and wherein the conjugated polymer includes a functional group configured to link to the part of the substrate; and
    imaging the photoluminescent material on the part of the substrate using an inspection system, wherein the inspection system includes a light source, a stage to hold the substrate, and a detector configured to detect photoluminescent emission from the photoluminescent material.

2. The method of claim 1, wherein the conjugated polymer includes poly(m-phenylene ethynylene) (PPE).

3. The method of claim 1, wherein the conjugated polymer includes poly(para-phenylene vinylene) (PPV).

4. The method of claim 1, wherein the conjugated polymer has the meta-linkage.

5. The method of claim 1, wherein the conjugated polymer has the ortho-linkage.

6. The method of claim 1, wherein the conjugated polymer has a molar extinction ratio of greater than $10^6$ $M^{-1}$ $cm^{-1}$ and a quantum yield of greater than 50%.

7. The method of claim 1, wherein the substrate is a semiconductor wafer.

8. The method of claim 1, wherein the part of the substrate is a metal.

9. The method of claim 8, wherein the metal is copper, tungsten, cobalt, ruthenium, or aluminum.

10. The method of claim 1, wherein the part of the substrate is an insulator.

11. The method of claim 1, wherein the part of the substrate has a feature dimension of 20 nm or less.

12. The method of claim 1, wherein the coiled macroscopic molecular shape is less than or equal to 5 nm in diameter.

13. The method of claim 12, wherein the diameter is less than or equal to 4 nm.

14. The method of claim 12, wherein the diameter is from 2-5 nm.

15. The method of claim 1, wherein the functional group includes a thiol, phosphonate, silane, catechol, or galloyl.

16. The method of claim 1, further comprising performing defect detection of the substrate using an image from the imaging, wherein the photoluminescent emission of the photoluminescent material is used during the defect detection.

* * * * *